(12) United States Patent
Grochowski et al.

(10) Patent No.: US 7,622,961 B2
(45) Date of Patent: Nov. 24, 2009

(54) METHOD AND APPARATUS FOR LATE TIMING TRANSITION DETECTION

(75) Inventors: Edward Grochowski, San Jose, CA (US); Chris Wilkerson, Portland, OR (US); Shih-Lien L. Lu, Portland, OR (US); Murali Annavaram, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 48 days.

(21) Appl. No.: 11/234,548

(22) Filed: Sep. 23, 2005

(65) Prior Publication Data

US 2007/0164787 A1 Jul. 19, 2007

(51) Int. Cl.
*H03K 5/19* (2006.01)
(52) U.S. Cl. .................... 327/20; 327/145; 326/40; 326/46; 326/98
(58) Field of Classification Search .......... 326/46, 326/93–95, 98, 40; 327/20, 144–145; 713/500–503
See application file for complete search history.

(56) References Cited

U.S. PATENT DOCUMENTS

| | | | | | |
|---|---|---|---|---|---|
| 4,535,459 | A | * | 8/1985 | Hogge, Jr. | 375/324 |
| 5,223,755 | A | * | 6/1993 | Richley | 327/158 |
| 5,301,196 | A | * | 4/1994 | Ewen et al. | 370/518 |
| 5,317,219 | A | | 5/1994 | Lupi et al. | |
| 5,398,262 | A | | 3/1995 | Ahuja | |
| 5,579,352 | A | * | 11/1996 | Llewellyn | 375/376 |
| 5,917,356 | A | * | 6/1999 | Casal et al. | 327/236 |
| 6,058,152 | A | * | 5/2000 | Tanishima | 375/376 |
| 6,100,732 | A | * | 8/2000 | Penry et al. | 327/144 |
| 6,121,804 | A | * | 9/2000 | Bryan et al. | 327/144 |
| 6,225,831 | B1 | * | 5/2001 | Dalmia et al. | 327/12 |
| 6,259,274 | B1 | * | 7/2001 | Endou et al. | 326/93 |
| 6,545,508 | B2 | * | 4/2003 | Senba | 327/20 |
| 7,088,796 | B2 | * | 8/2006 | Djahanshahi et al. | 375/376 |
| 7,092,474 | B2 | * | 8/2006 | Cao | 375/371 |
| 7,190,906 | B2 | * | 3/2007 | Cao | 398/155 |
| 2001/0030566 | A1 | * | 10/2001 | Sahu | 327/276 |
| 2001/0033407 | A1 | * | 10/2001 | Cao | 359/158 |
| 2004/0078661 | A1 | * | 4/2004 | Nakano et al. | 714/22 |

FOREIGN PATENT DOCUMENTS

| | | |
|---|---|---|
| JP | 09 200491 | 7/1997 |
| JP | 2005 214732 | 8/2005 |

OTHER PUBLICATIONS

International Application PCT/US2006/036153 PCT Search Report & Written Opinion dated Mar. 29, 2007.

(Continued)

*Primary Examiner*—Vibol Tan
*Assistant Examiner*—Jason Crawford
(74) *Attorney, Agent, or Firm*—Blakely, Sokoloff, Taylor & Zafman LLP

(57) ABSTRACT

Two latches store the state of a data signal at a transition of a clock signal. Comparison logic compares the outputs of the two latches and produces a signal to indicate whether the outputs are equal or unequal. Systems using the latches and comparison logic are described and claimed.

7 Claims, 6 Drawing Sheets

OTHER PUBLICATIONS

PCT International Preliminary Report on Patentability, PCT/US2006/036153 issued Mar. 26, 2008 (1 page).
PCT Written Opinion PCT/US2006/036153 issued Mar. 26, 2008 (5 pages).
UHT: Going Beyond Worst-Case Specs with TEAtime, IEEE Computer Society, Mar. 2004, pp. 51-56.
Thomas Knight et al., "A Method for Skew-free Distribution of Digital Signals Using Matched Variable Delay Lines", Artificial Intelligence Laboratory and Dept. of Electircal Engineerign and Computer Science, Mass. Institute of Technology, A.I. Memo No. 1282, Mar. 1992, pp. 1-13.
Knight, C.G., et al. "An IDDQ Sensor for Concurrent Timing Error Detection", IEEE, 1997, pp. 281-289.
Ernst, D., et al., "Razor: A Low-Power Pipeline Based on Circuit-Level Timing Speculation", Proc. of 36th Int'l Symp. on Microarchitecure, IEEE, 2003, 12 pp.
Uht, A.K., "Going Beyond Worst-Case Specs with TEAtime", IEEE Computer Society, Mar. 2004, pp. 51-56.

* cited by examiner

METHOD AND APPARATUS FOR LATE TIMING TRANSITION DETECTION

FIELD OF THE INVENTION

Embodiments of the invention relate to circuit timing. More specifically, embodiments relate to adjusting circuit timing parameters to increase performance and/or avoid operational errors. Other embodiments are also described and claimed.

BACKGROUND

Electronic circuits often operate synchronously, under the control of one or more clock signals. The speed of operations can be increased by increasing clock frequencies until signal propagation and other delays become long enough in relation to the clock periods that signals are no longer reliably received within the correct cycle. (Operational frequency is also correlated with power consumption, supply voltage and heat generation, so power and thermal effects may also limit the maximum speed at which a circuit can be operated.)

Some complex circuits, such as microprocessors and digital signal processors, exhibit significant device-to-device variability in maximum clock frequency due to variations in manufacturing conditions, material properties, and other factors. Such devices can be graded after manufacturing by testing them under worst-case conditions with increasing clock frequencies. After determining the frequency at which the device begins to operate inconsistently, a safety factor is applied and the device is certified for use at a particular, lower frequency.

This method of setting maximum operational frequency is fairly reliable (given a sufficiently wide guard band) but may give up performance when the device is operated under better-than-worst-case conditions. Furthermore, static, manufacture-time grading fails to account for the natural change over time in the characteristics of the device.

BRIEF DESCRIPTION OF DRAWINGS

Embodiments of the invention are illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

DETAILED DESCRIPTION OF DRAWINGS

Embodiments of the invention monitor important timing parameters of a device dynamically, while the device is in normal operation (e.g. during its integration into a system, or thereafter while the system is in use by an end user). An impending timing failure may be signaled and/or operational parameters may be automatically adjusted to obtain improved performance under actual environmental conditions.

Figure 1:
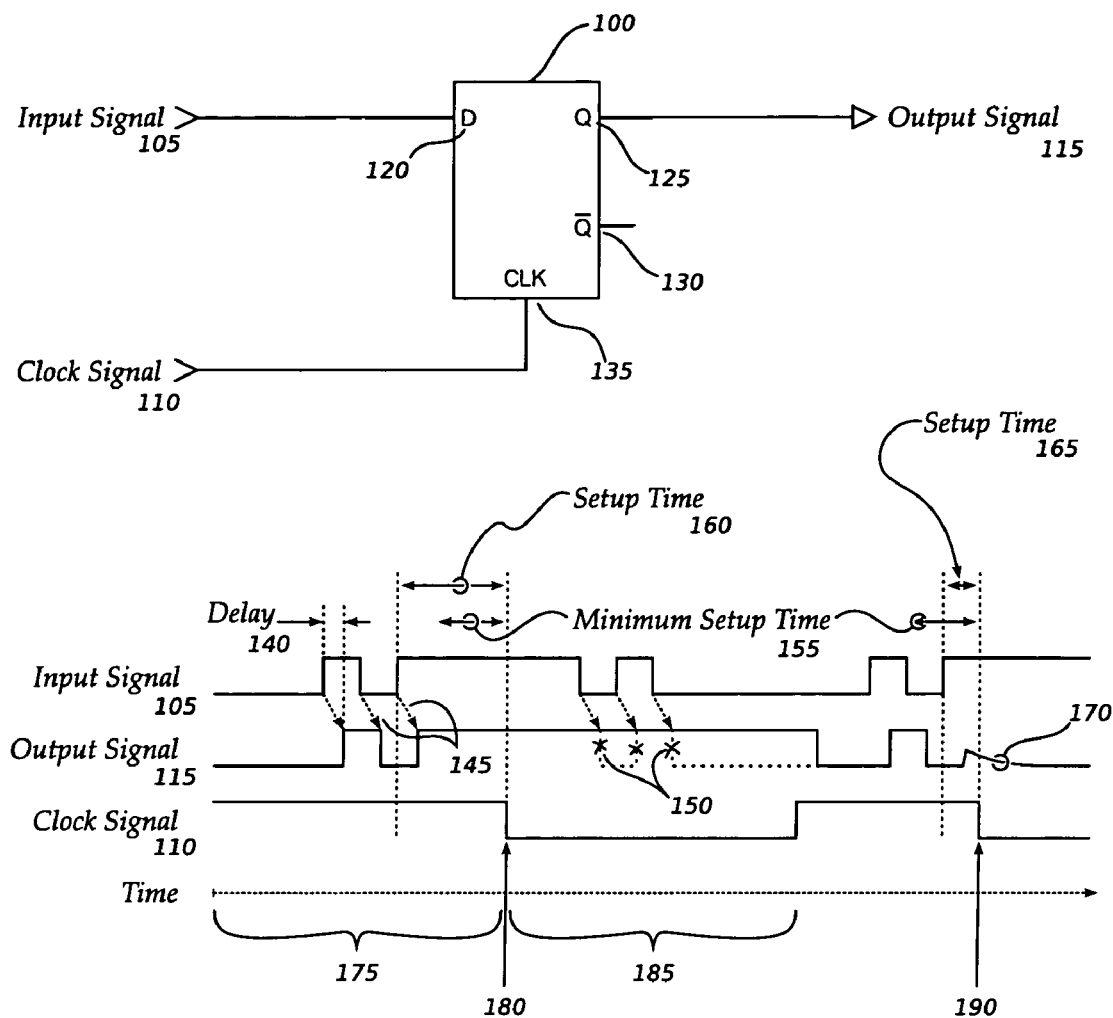
FIG. 1 is a timing diagram showing parameters of relevance to embodiments of the invention.

FIG. 1 shows a circuit symbol for a transparent latch, 100, and a timing diagram that illustrates some aspects of the latch's operation. While the clock signal 110 at CLK input 135 is at a first level (during time period 175), changes in the input signal 105 present at the D input 120 propagate to the Q output 125 after a delay 140 (see transitions 145 in the timing diagram trace of output signal 115). When the clock signal transitions to a second level at time 180, the latch stores the value of the input signal 105 that was present at D input 120, and subsequent transitions on the D input do not affect the Q output (note lack of transitions during time period 185 as shown at 150). The input signal at the D input must be stable for at least a short period of time 155 (called the "minimum setup time") before the clock edge at time 180. Setup time 160 is longer than the minimum setup time 155, so the latched output signal during time period 185 is correct. If the input signal is not stable during the setup time, however, the latch may not store the correct value. This is shown near the right side of the timing diagram: input signal 105 is only stable for setup time 165 before the clock edge at time 190. Setup time 165 is shorter than the minimum setup time 155, so the output signal 115 does not correctly reflect the value of the input signal at time 190 (see portion of output signal 115 indicated at element 170). This is an example of the incorrect operation that might occur when a circuit is clocked at too high a frequency or when a data signal arrives late with respect to the clock edge that is to cause a latch to record it.

Although the timing diagrams in FIG. 1 indicate that the latch is transparent when the clock signal high and that it latches the data present at a falling edge of the clock, other latches may be transparent when the clock is low, and latch data present at a rising clock edge. In some circuit designs, inverting latches may be preferred for space, speed, or efficiency reasons. Other circuits may employ sub-units that are like latches in their requirement of a minimum set-up time on a data signal, but are not transparent latches (for example, an edge-triggered flip-flop). These alternate latches and latch-like circuits can also be used with an embodiment of the invention.

Figure 2:
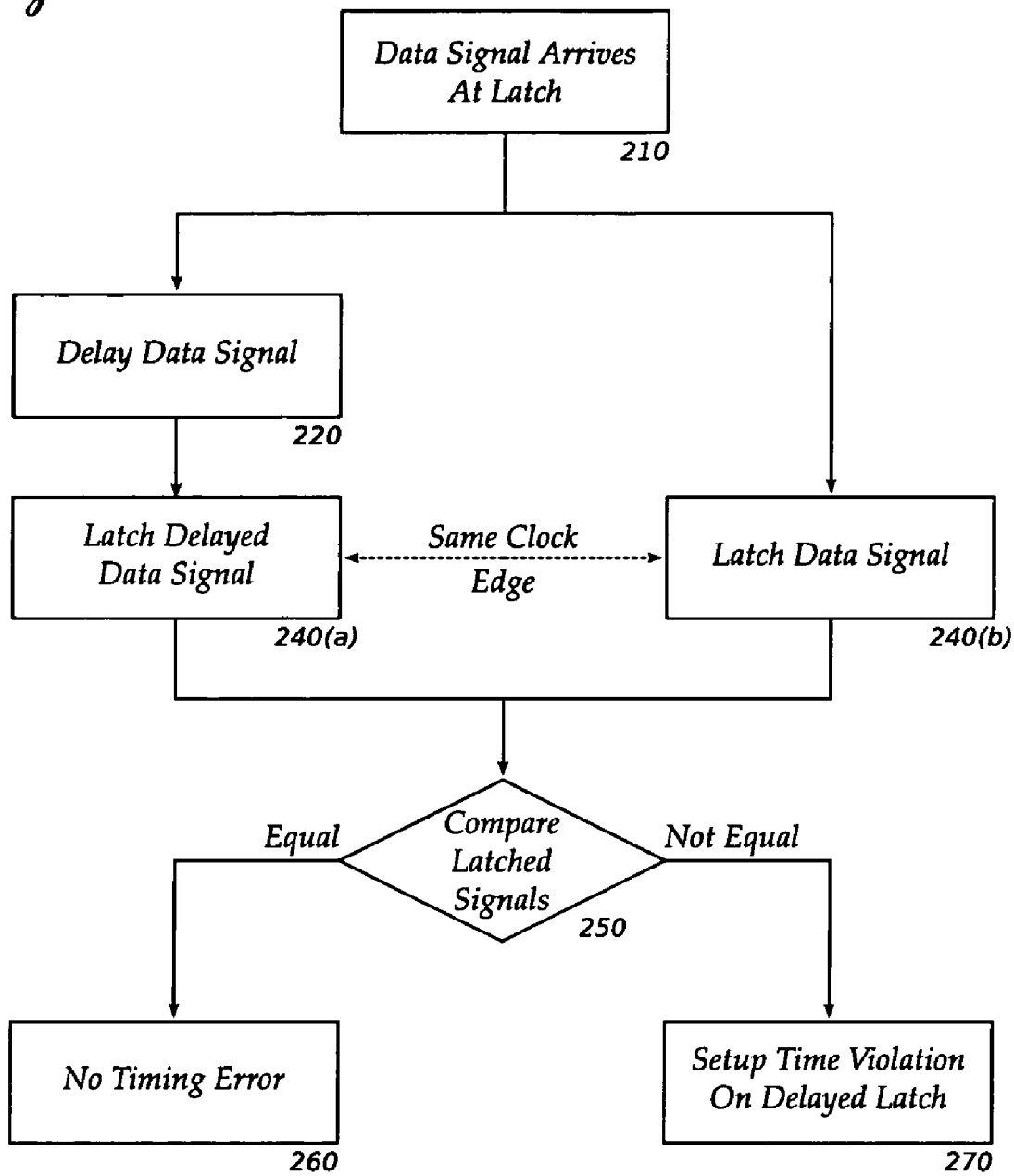
FIG. 2 is a flow chart outlining the operations of an embodiment of the invention.

A circuit implementing an embodiment of the invention can detect imminent timing failures (latch failures due to insufficient setup times) by operating according to the flow chart in FIG. 2. A data signal is conducted to an area of the circuit where the signal is to be latched (210). A delayed version of the data signal is also made available (220). The data signal and the delayed data signal are latched in two latches (one signal per latch) at an edge of a clock signal (240(a) and 240(b)). The undelayed signal will have a particular setup time with respect to the clock edge, and the delayed signal will have a second, shorter setup time with respect to the clock edge. The second setup time will be shorter than the first by the length of the signal delay.

Next, the first latched signal and the second latched signal are compared (250). If the latched values are equal, then both latches were able to store the correct value, so no timing error occurred (260). If the latched values are unequal, then the setup time at the second latch was probably shorter than the minimum setup time (270).

The result of the comparison provides an indication of how close the current circuit operating conditions are to failure. If the latches are both working correctly, then the circuit could be operated faster by, for example, increasing the clock speed. Alternatively, the circuit's power consumption could be reduced by lowering its operating voltage. Other operational parameters might be adjusted instead to achieve a different goal, without significant risk of causing incorrect operation due to timing violations.

However, if the second latch has failed to store the correct value, it indicates that the circuit is operating near its maximum speed under the conditions. The first latch has the correct value, since its setup time was longer than the second latch's, but any condition changes that would tend to reduce timing margins (e.g. increasing clock frequency, lowering operating voltage) might push the circuit into incorrect operation. The circuit has not actually failed (the first latch contains the correct value), so there is still some remaining timing safety margin. The margin may be no greater than the delay in the data signal supplied to the second latch.

Figure 3:
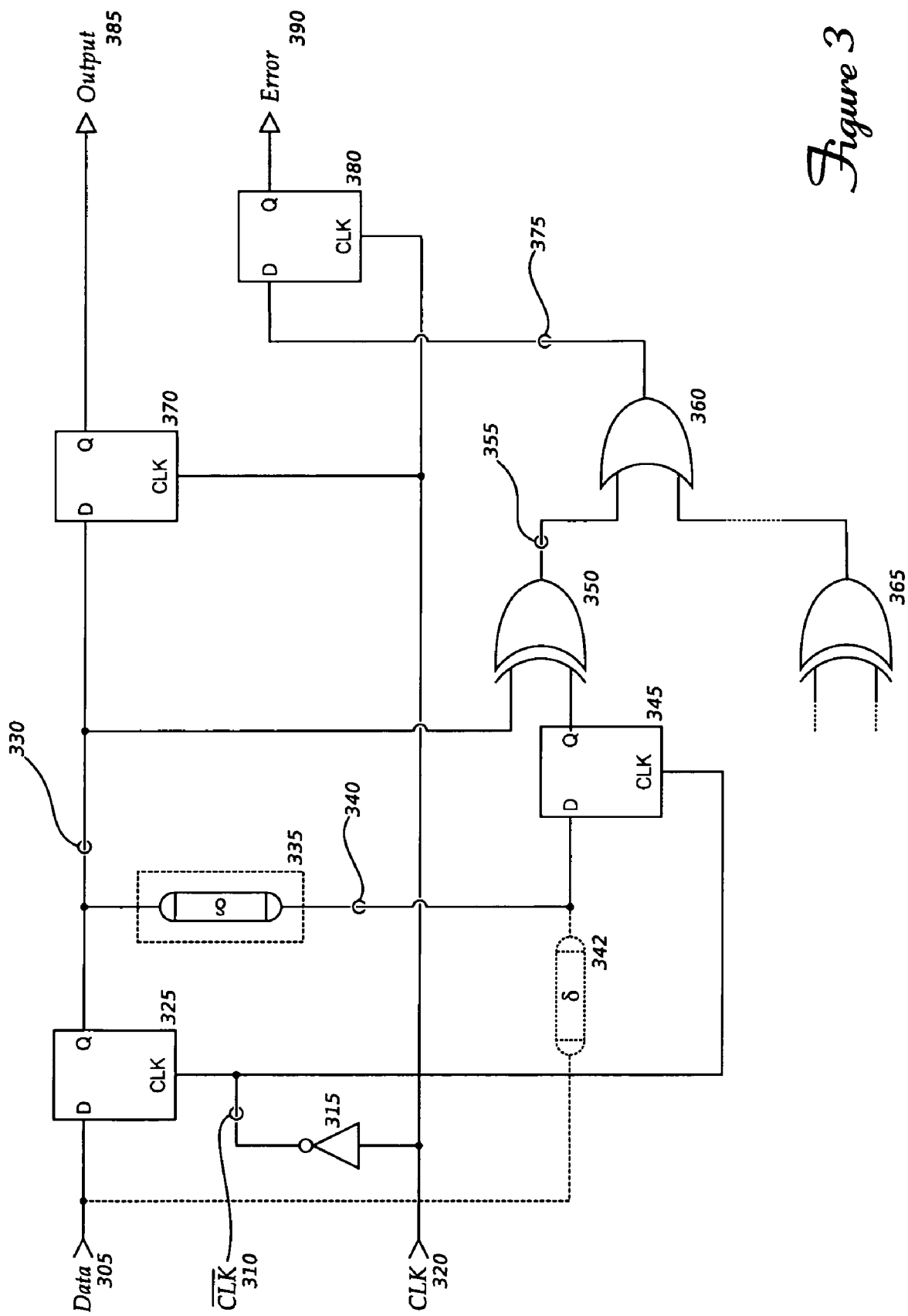
FIG. 3 is a circuit schematic showing another embodiment of the invention.

FIG. 3 shows a practical circuit that uses an embodiment of the invention to assess current timing margins and to detect late timing transitions. Latches 325 and 370 may be transparent latches such as described with reference to FIG. 1. They are arranged in a master-slave configuration that might commonly be found in a register, cache, arithmetic logic unit ("ALU") or other structure. The master latch, 325, is controlled by one phase of a clock signal 310, and the slave latch, 370, is controlled by another phase of the clock. The clock controlling the master latch 325 ($\overline{CLK}$, 310) is shown being generated locally by inverter 315, but both phases may be generated elsewhere in the circuit and delivered to the latches through a clock distribution tree.

On the falling edge of $\overline{CLK}$ 310, master latch 325 latches the data present at its input, and on the subsequent falling edge of CLK 320 (which, here, corresponds to the subsequent rising edge of $\overline{CLK}$ 310), slave latch 370 latches the value from master latch 325.

The output of master latch 325 is also communicated to late timing transition detector ("LTTD") latch 345, which latches its input on the same falling edge of $\overline{CLK}$ that triggers master latch 325. Because of the delay through master latch 325 (refer to element 140 of FIG. 1), LTTD latch 345 has a shorter setup time than master latch 325. In some embodiments, the setup time at LTTD latch 345 may be further shortened by delaying the signal from master latch 325 through a delay structure 335. If master latch 325 is not transparent or fails to introduce a useful delay for some other reason, input data signal 305 may be connected directly to LTTD latch 345 through a delay structure, as shown at 342.

Figure 4:
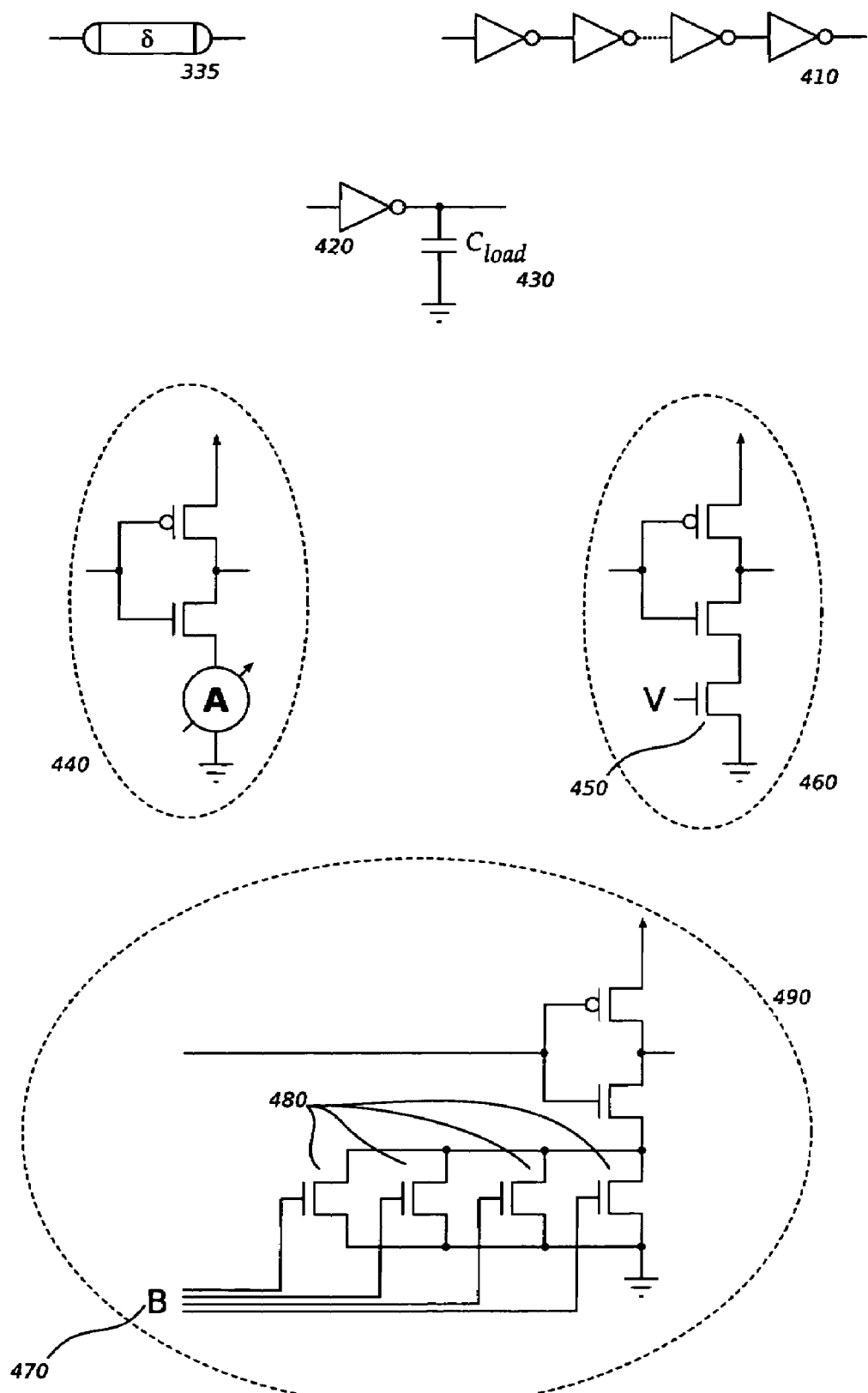
FIG. 4 shows several alternate implementations of a component in FIG. 3.

Referring briefly to FIG. 4, delay structure 335 may be implemented as a chain of inverters 410. The delay is proportional to the number of inverters in the chain. An even number of inverters preserves the sense of the data signal, while an odd number may be used if other logic operations are adjusted accordingly. Delay structure 335 may provide additional control and flexibility in an embodiment if the delay is adjustable. Variable delays can be obtained by modifying an inverter stage 410 or a load capacitance 430, among other techniques. Element 440 shows how an inverter might be modified by providing an adjustable current sink in a pull-down leg of the circuit. For example, transistor 450 in circuit fragment 460 permits the inverter timing to be altered under the control of an analog voltage V. Digital control of the inverter timing might be accomplished by placing a number of pull-down transistors in parallel, as shown at element 480 in circuit fragment 490. The speed of inverter in 480 can be adjusted according to four digital signals B, each controlling one of transistors 480. The number and width of transistors 480 may be selected to permit delay to be controlled according to an n-bit binary number. Adjustable delay structures can also be constructed by attaching more or larger load capacitances to an output signal line through controllable switches (not shown).

Returning to FIG. 3, the outputs of master latch 325 and LTTD latch 345 are compared by, for example, exclusive-OR ("XOR") gate 350. The output 355 of XOR gate 350 is low when the latches are in the same state and high when the latches are in different states. Therefore, signal 355 is high when data signal 305 has a short, but still acceptable, setup time, while delayed data signal 340 has a short and unacceptable setup time. Comparisons of other LTTD latches and their corresponding master latches (e.g. XOR gate 365) may be combined through OR gate 360, whose output 375 signals when one or more LTTD latches disagree with their master latches. The output of the OR gate may be synchronized with the clock by latching it in transparent latch 380. A "1" from latch 380 indicates that one or more LTTD latches experienced a setup time failure.

Various modifications to the circuit of FIG. 3 will be apparent to those of ordinary skill. For example, if inverting latches are used (for space, power, or speed reasons as mentioned previously), then an odd number of inverters in delay structure 335 or an exclusive NOR ("XNOR") gate may be substituted to preserve the logical operation described. The XOR (XNOR) gates and the OR tree may be built with either static or dynamic logic elements. If implemented in a Complementary Metal-Oxide Semiconductor ("CMOS") process, "domino" gate designs may be used. The LTTD latch could also receive its input from the same signal as the main latch (rather from the output of the latch), with a delay inserted directly as shown by dashed line 342.

Figure 5:
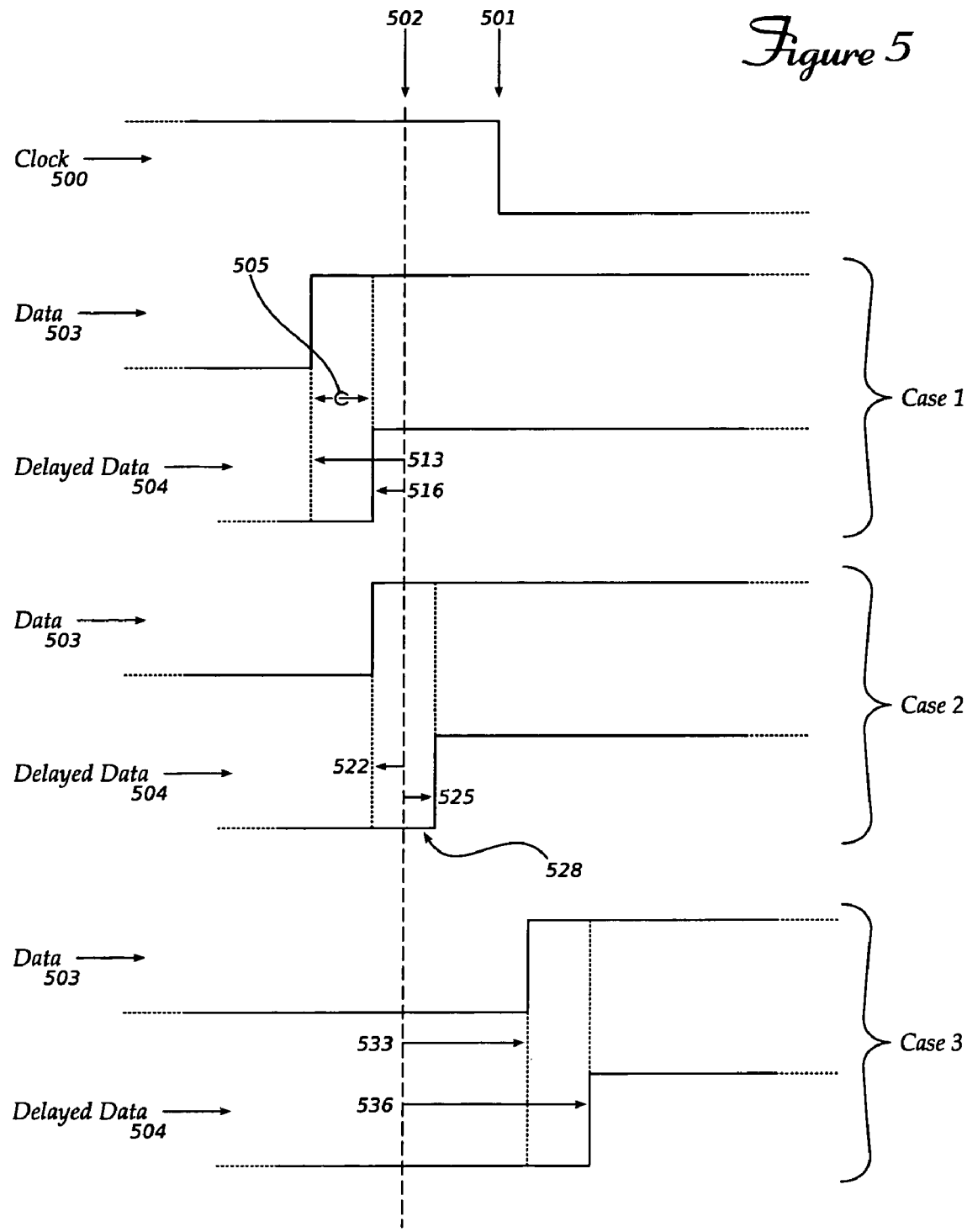
FIG. 5 shows timing diagrams of three operating regimes of an embodiment of the invention.

FIG. 5 shows three possible timing cases for master and LTTD latches. In the first case, both the data signal 503 and the delayed data signal 504 are stable before the minimum setup time 502, and so both latches store the correct value at the clock transition 501. The signals stabilize at times 513 or 516, respectively, before the minimum setup limit 502. No error is signaled.

In case 2, as the data signal 503 arrives later with respect to the clock edge 501 at which it is to be latched, the delayed data signal 504 will eventually fail to meet the minimum setup time. The LTTD latch will settle at the wrong value, and an error will be signaled. Note that data 503 still meets the minimum setup time (time 522 occurs before 502), but delayed data 504 does not stabilize until time 525, after 502. The transition at 528 is late, and causes the LTTD latch to store an incorrect value.

In case 3, the data signal 503 arrives even later, so it too fails to meet the minimum setup time. Both the master latch and the LTTD latch will contain incorrect values. This case is indistinguishable from the early arrival of a data signal due to be latched in the following cycle. No error is signaled.

Figure 6:
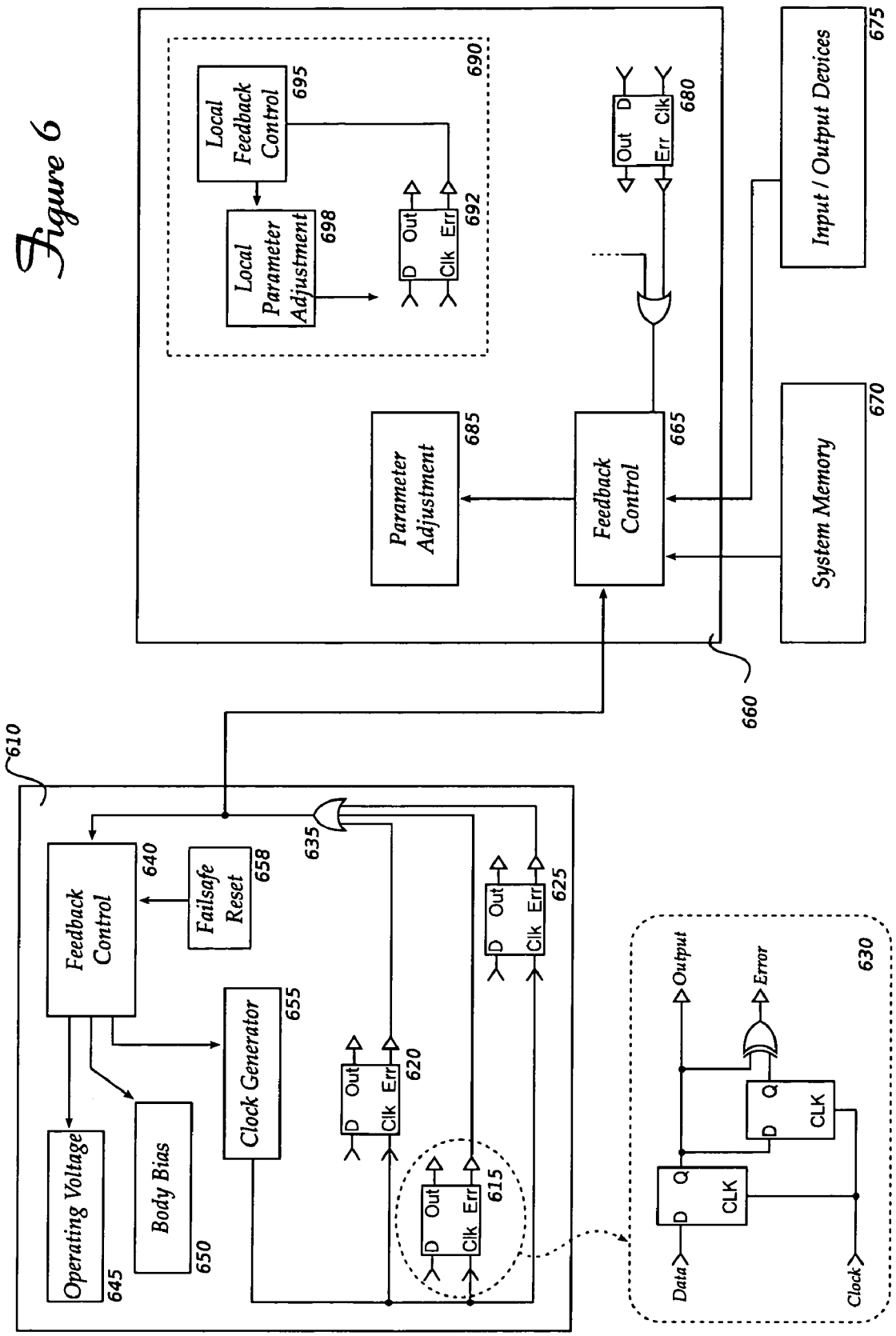
FIG. 6 shows a larger system employing embodiments of the invention.

An embodiment of the invention can be used in a feedback loop that controls one or more operating parameters of a circuit, as shown in FIG. 6. The circuit may be a monolithic device such as a CMOS integrated circuit consisting of a number of functional units. FIG. 6 shows two circuits, 610 (which may be, for example, a digital signal processor ("DSP")), and 660 (which may be a computer central processing unit ("CPU")).

Master-slave latches or other flip-flops, augmented with a late timing transition detector latch and comparator similar to that shown in FIG. 3, may be placed at various physical locations around monolithic circuits 610 and 660 (for example, at 615, 620, 625, 680 and 692). Inset 630 shows some elements of the augmented latches. Latches and flip-flops often occur in commonly-clocked banks or arrays, and not all the latches in such an array need be instrumented. Instead, one LTTD latch can monitor the operations of a group of latches that are commonly clocked and receive data that is likely to experience similar delays between the data signal source and the latch inputs.

LTTD comparator ("error") outputs can be combined through, for example, OR gate 635. As mentioned with reference to FIG. 3, the error signal may be synchronized to a clock by storing it in another latch (not shown). The error signal indicates that one or more of the LTTD monitors signaled a possible imminent timing failure. This error signal is provided to a feedback control circuit 640, which can adjust circuit parameters such as the operating voltage 645, substrate body bias 650, or clock frequency 655. The feedback control circuit may adjust circuit parameters to achieve a predetermined ratio of error to no-error signals. If the target ratio of error to no-error signals is low, the circuit will operate with comfortable safety margins, but will give up some performance (for example, it will operate more slowly than it could, or it will consume more power than is strictly necessary). If the target ratio is high, the circuit will operate with reduced safety margins, but will gain performance.

The feedback loop should change parameters gradually to avoid passing from the first timing case of FIG. 5 (no errors signaled, large timing margins) directly to the third timing case (no errors signaled but timing margins violated) without detecting errors in timing case two. In some embodiments, a failsafe-reset circuit 658 may be used to force the feedback loop to a "slow" extreme condition before permitting the loop to resume optimizing operating parameters.

The logic controlling the feedback loop may be implemented in software or firmware (as well as in hardware) that has access to the error signal from the LTTD circuitry. Such an implementation may permit more flexible control of the system. For example, the software could adjust operating parameters to reduce power consumption when the system was operating from batteries, and to increase performance when adequate power and cooling were available. Other, more complex performance profiles could also be specified.

Software could also coordinate broader system operation by monitoring timing errors from a number of separate circuits. For example, a feedback control circuit in a CPU 660 could adjust system parameters 685 (e.g. voltage, clock frequency) in response to error signals from other system components such as DSP 610, memory 670 and input/output devices 675, as well as error signals from LTTD latches 680 within the CPU itself. overall system clock could be adjusted in response to signals from a DSP a CPU, memory controller, and main memory. Alternatively, a functional unit within a monolithic device, such as floating point unit ("FPU") 690, could be fitted with a local feedback control 695 and local parameter adjuster 698 to permit local operating parameters to be adjusted in response to error signals from LTTD latches 692 within the functional unit.

An embodiment of the invention may be a machine-readable medium having stored thereon instructions which cause a processor to perform operations as described above. In other embodiments, the operations might be performed by specific hardware components that contain hardwired logic. Those operations might alternatively be performed by any combination of programmed computer components and custom hardware components.

A machine-readable medium may include any mechanism for storing or transmitting information in a form readable by a machine (e.g., a computer), including but not limited to Compact Disc Read-Only Memory (CD-ROMs), Read-Only Memory (ROMs), Random Access Memory (RAM), Erasable Programmable Read-Only Memory (EPROM), and a transmission over the Internet.

The applications of the present invention have been described largely by reference to specific examples and in terms of particular allocations of functionality to certain hardware and/or software components. However, those of skill in the art will recognize that performance enhancement based on late timing transition detection can also be achieved by software and hardware that distribute the functions of embodiments of this invention differently than herein described. Such variations and implementations are understood to be apprehended according to the following claims.

We claim:

1. A method comprising:
   latching a plurality of data signals in a corresponding plurality of latches in response to a first transition of a clock signal;
   latching one of the plurality of data signals in a timing latch in response to the first transition of the clock signal, the one of the plurality of data signals presented to the timing latch after a delay;
   detecting when the delayed one of the plurality of data signals fails to meet a minimum setup time of the timing latch causing the timing latch to store incorrect data, wherein the minimum setup time of the timing latch is the minimum time lapse during which the delayed one of the plurality of data signals must reach and become stable at the timing latch before the first transition of the clock signal;
   adjusting an operational parameter of a circuit using feedback logic so that the timing latch stores the one of the data signals incorrectly in a target proportion of clock signal transitions; and
   forcing, via failsafe-reset logic, the operating parameter to an extreme slow condition.

2. The method of claim 1, further comprising:
   altering the delay of the one of the data signals presented to the timing latch is to control a timing safety margin of the circuit, wherein the one of the plurality of data signals is delayed until it fails to meet the minimum setup time of the timing latch causing the timing latch to store incorrect data.

3. The method of claim 1 wherein the operational parameter is one of a voltage supplied to the electronic circuit, a body bias voltage applied to the electronic circuit or a frequency of a clock supplied to the electronic circuit.

4. An apparatus comprising:
   a clock input to receive a clock signal;
   a data input to receive a data signal;
   a first edge-triggered latch to store the data signal at a first edge of the clock signal if the data signal meets the minimum setup time of the first edge-triggered latch;
   a second edge-triggered latch to store a delayed version of the data signal at the first edge of the clock signal if the delayed version of the data signal meets the minimum set-up time of the second edge-triggered latch;
   an output to provide an error signal if the data signal meets a minimum setup time relative to the first edge of the clock signal, but the delayed version of the data signal fails to meet the minimum setup time of the second edge-triggered latch relative to the first edge of the clock signal causing the second edge-triggered latch to store incorrect data,
   wherein the minimum setup time is the minimum time lapse during which the data signal and the delayed data signal must reach and become stable at the first and second edge-triggered latches, respectively, before the first edge of the clock signal arrives;

a feedback controller to adjust an operating parameter of a circuit so that the output generates the error signal in a target proportion of a plurality of clock signal edges; and failsafe-reset logic to force the operating parameter to an extreme slow condition.

5. The apparatus of claim 4 wherein the operating parameter is one of an operating voltage, a body bias voltage or a clock frequency.

6. The apparatus of claim 4 wherein the data signal is delayed using an adjustable delay component, wherein the timing of the delayed data signal is adjusted until the delayed data signal fails to meet the minimum setup time of the second edge-triggered latch causing the second edge-triggered latch to store incorrect data.

7. The apparatus of claim 4 wherein the adjustable delay component is a digitally-adjustable delay component.

* * * * *